United States Patent
Thibado

(10) Patent No.: US 6,205,646 B1
(45) Date of Patent: *Mar. 27, 2001

(54) METHOD FOR AIR-WOUND COIL VACUUM PICK-UP, SURFACE MOUNTING, AND ADJUSTING

(75) Inventor: David H. Thibado, Baldwinsville, NY (US)

(73) Assignee: Philips Electronics North America Corp., New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/217,429

(22) Filed: Dec. 21, 1998

(51) Int. Cl.$^7$ ..................................................... H01F 7/06
(52) U.S. Cl. ............................. 29/602.1; 29/605; 29/843; 29/840; 336/192
(58) Field of Search .................... 29/602.1, 832, 29/840, 739, 843, 825, 606, 605; 336/192, 205, 200, 225, 227, 228

(56) References Cited

U.S. PATENT DOCUMENTS

| | | | |
|---|---|---|---|
| 2,722,662 | * | 11/1955 | Tyminski ................................ 336/20 |
| 3,648,205 | * | 3/1972 | Bunch et al. ........................... 336/20 |
| 3,824,518 | * | 7/1974 | Slenker ................................... 336/96 |
| 3,947,934 | * | 4/1976 | Olson .................................... 29/25.42 |
| 4,035,695 | * | 7/1977 | Knutson et al. ....................... 361/400 |
| 4,325,040 | * | 4/1982 | Whitley ................................... 334/17 |
| 4,759,120 | * | 7/1988 | Bernstein ................................ 29/605 |
| 4,866,573 | * | 9/1989 | Bernstein .............................. 361/400 |
| 4,980,663 | * | 12/1990 | Moyer ...................................... 334/8 |
| 5,809,633 | * | 9/1998 | Mundigl et al. ........................ 29/600 |
| 5,867,897 | * | 2/1999 | Mimura et al. ......................... 29/840 |
| 5,894,292 | * | 4/1999 | Everest, III et al. ................. 343/895 |

FOREIGN PATENT DOCUMENTS

| | | | |
|---|---|---|---|
| 652761 | * | 1/1960 | (CA) ................................... 29/602.1 |
| 3-35509 | * | 2/1991 | (JP) . |
| 6-36937 | * | 2/1994 | (JP) ................................... 29/602.1 |
| 10-313155 | * | 11/1998 | (JP) . |

\* cited by examiner

*Primary Examiner*—Lee Young
*Assistant Examiner*—Minh Trinh
(74) *Attorney, Agent, or Firm*—Michael E. Belk

(57) ABSTRACT

An air-wound, coil-type, passive inductor includes a surface which allows the coil to be picked-up using a vacuum probe of a head of a pick-an-place machine and the surface does not interfere with adjusting the spacing between the loops of the coil for tuning the coil after the coil is attached to a circuit board. Terminal ends of the coil are placed on solder paste on interconnection pads on the circuit board, then the board is heated to reflow the solder, and then washed to remove the flux contained in the solder paste. The surface may be adapted to be removed or at least degraded by the heating, or the washing, or afterwards by a mechanical method of removal without damaging the coil.

14 Claims, 5 Drawing Sheets

METHOD FOR AIR-WOUND COIL VACUUM PICK-UP, SURFACE MOUNTING, AND ADJUSTING

FIELD OF THE INVENTION

The invention is related to electronic air-wound coil components and handling these components in circuit board manufacture, and more specifically to methods and apparatus for handling these components in a pick-and-place machine and adjusting the coils subsequent to attachment to a circuit board, for tuning the coils and/or circuits in which they are interconnected.

BACKGROUND

Coils are commonly used as inductor elements in electronic circuits. The coils consist of wire bent to form a series of spaced loops. In high frequency applications, such as radio frequency broadcasting, cable television, cellular phones and other communications technology, air-wound coils are often surface mounted on circuit boards.

Circuit boards are commonly produced by forming wiring that extends on the surface and through holes in a sheet of fiberglass. The wiring includes pads for attaching components to the board. Solder paste is deposited on the pads and then terminals of the components are positioned on the solder paste. Then the assembly is heated sufficient to melt particles of metal in the solder paste to form solder alloy connections between the pads and the component terminals.

A pick-and-place machine is used to place the components onto the wiring substrate. Wiring substrates and components are fed into the machine and a head picks-up the components and places them at component sites on the board. Typically the solder paste is deposited on pads at the component site before the board is fed into the machine. The head includes either a vacuum probe or a mechanical gripper to pick-up, position, and release the components at the sites.

Generally, the position of a coil is not nearly as critical as the positioning of other common components on the circuit board substrate and grippers can place such coil components onto circuit boards without the need for a vision system. Since the surface of uncoated air-wound coils has openings, common vacuum probes can not be used to pick-up the coil components. Thus, mechanical grippers are typically used for placing air-wound coils. However, it is well known to coat the coils of an air-wound coil with a layer of epoxy to allow the coils to be handled using a vacuum probe. In some applications the coils can not be covered with epoxy because the spacing between the loops must be adjusted for tuning the coil and/or circuit of the circuit board. In such a case, uncoated coils are placed on the circuit board using a gripping head.

SUMMARY OF THE INVENTION

It is an object of the invention to provide methods and apparatus for utilizing vacuum probes for pick-up and placement of air-wound coils that may require post attachment tuning.

As the speed at which pick-an-place machines operate increases, and the price of vision systems is reduced, vacuum probe pick-up has generally displaced gripping as a method of picking-up components. Typically, the only components on a circuit board that requires a gripper head is an air-wound coil that requires post attachment tuning. For this one component, the head must be changed from a vacuum probe head to a gripper head, the component placed, and then the gripper head is replaced with a vacuum head for placing other components.

In the invention, a surface of material is provided on the top surface of the coil, and the surface or material thereof is adapted so that it will not interfere with bending the coil to adjust the spacing between loops after the coil is attached to the circuit board. In one particularly preferable embodiment, the surface is inherently removed during heating for reflow soldering the components to the circuit board or during washing of the assembled circuit board with a solvent to remove flux residue after the reflow heating. In another particularly preferred embodiment, the surface is mechanically connected to the coil so that it can easily and reliably be disconnected. Alternately, the surface can be cut, broken, stretched between the loops without damaging the coil so that the loop spacing can be adjusted.

Other alternatives and advantages of applicant's inventions will be disclosed or become obvious to those skilled in the art by studying the detailed description below with reference to the following drawings which illustrate the elements of the appended claims of the inventions.

DETAILED DESCRIPTION OF PREFERRED EMBODIMENTS

Figure 1:
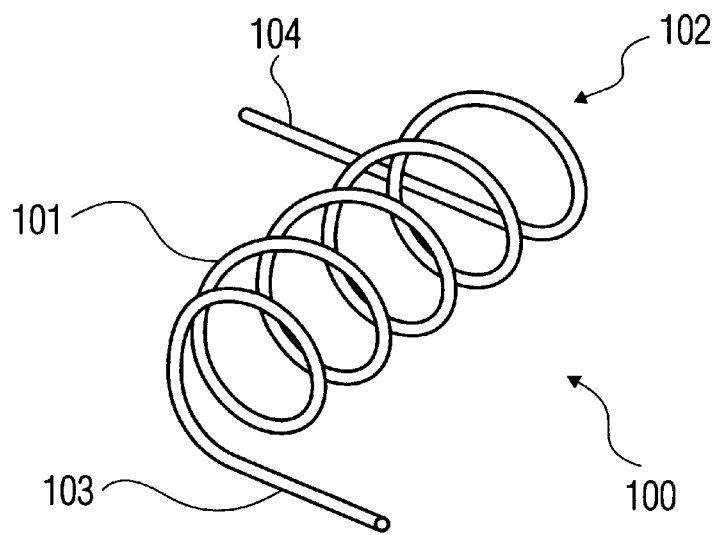
FIG. 1 shows an air-wound coil-type passive inductor with terminals extending tangentially from each end of the coil.

In FIG. 1 a prior art air-wound coil-type passive inductor 100 includes a wire 101 bent to form a series of loops as shown which define coil 102. The ends of the wire extend tangentially from each end of the coil to form terminals 103 and 104.

Figure 2:
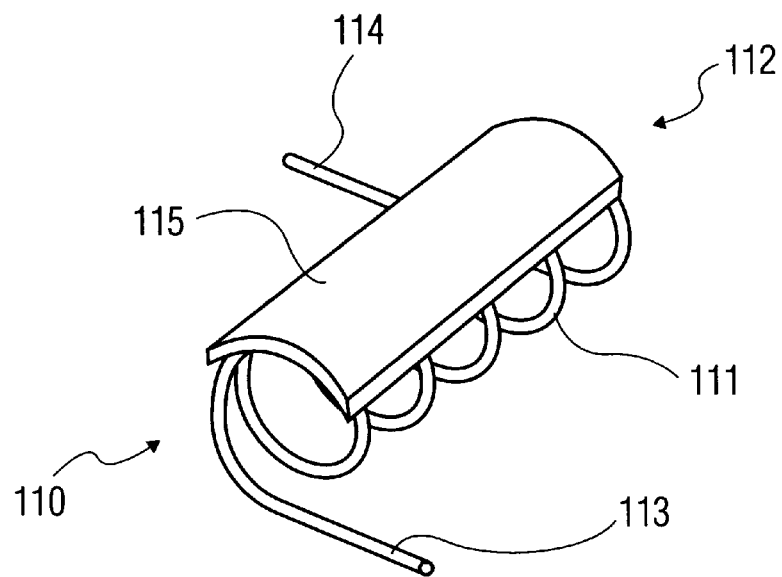
FIG. 2 illustrates a component of the invention with a pick-up surface connected to a coil for picking up the component using a vacuum probe and the surface is adapted for adjusting the loop spacing of the coil without otherwise damaging the coil.

In FIG. 2, component 110 of the invention includes a pick-up surface 115 connected to coil 112 similar to the prior art coil 102 of FIG. 1. The surface allows the component to be picked up and placed using a vacuum probe (not shown) of a pick-and-place machine (not shown). The surface is adapted for adjusting the loop spacing of the coil without otherwise damaging the coil after the component is attached to a circuit board substrate. A wire 111 is bent to form the coil and the ends of the coil form terminals 113 and 114 which are attached to pads of the circuit board as described below.

Figure 3:
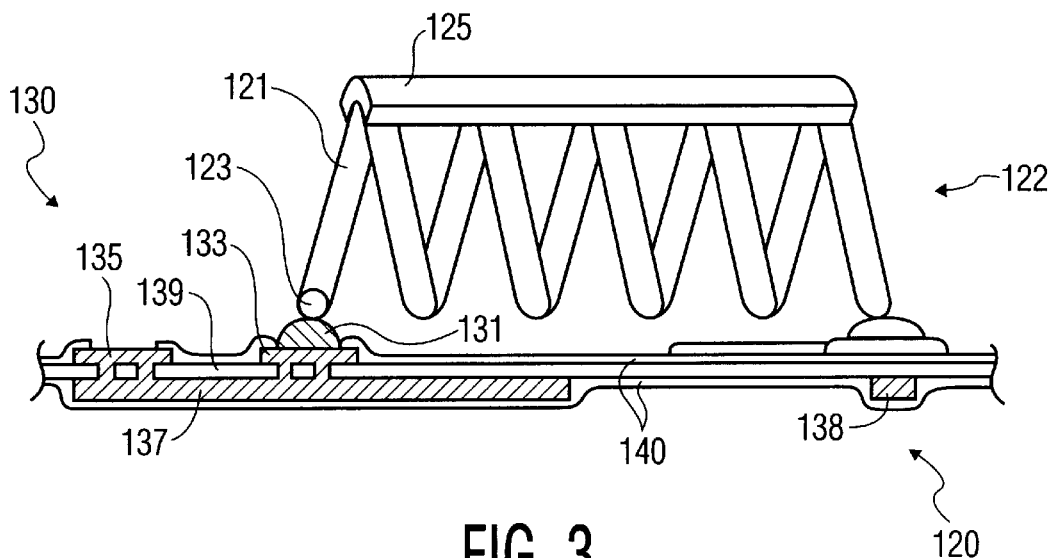
FIG. 3 shows the component of FIG. 2 with terminals placed on solder paste on connection pads of a wiring board.
Figure 4:
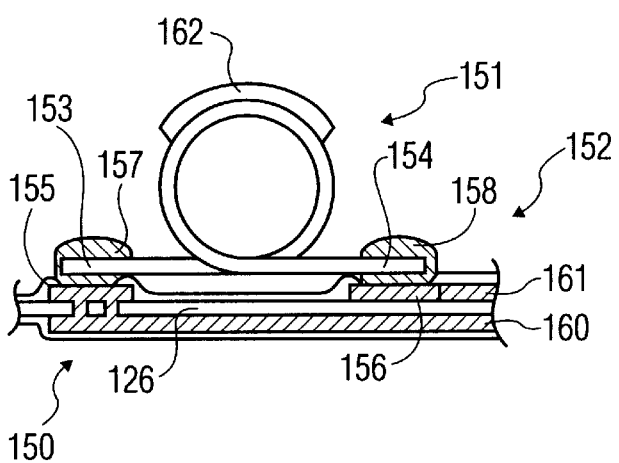
FIG. 4 presents an end view of the component of FIG. 2 connected to the circuit board after reflow soldering.
Figure 5:
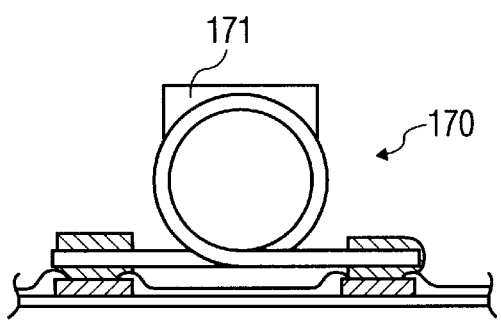
FIG. 5 illustrates a component with a flat top surface for pick-up by a less flexible tip of a vacuum probe.

The terminals may be straight sections of the wire that forms the coil, as shown in FIG. 1, with these straight sections extending tangentially from the coil so that these terminals can be placed on a flat pad on a circuit board, as shown in FIGS. 3–5. The coil is preferably an air coil as shown, that is, the coil does not contain a core. Preferably, the coil is made from a highly conductive metal such as highly purified copper. The wire of the coil may be 0.05 to 1 mm in diameter and the coils are spaced between 1.1 and 20 times the diameter of the wire, and more preferably from 2 to 10 times the diameter of the wire. The coils are spaced between 2 and 10 times the diameter of the wire and the diameter of the loops is between 10 and 100 times the diameter of the wire. The loops are produced with a predetermined manufacturing tolerance, and after the coil is connected to a circuit board, the spacing of the loops is adjusted, such that the loop spacing is outside the manufacturing tolerance of the loops.

As described below, the surface may be inherently removed during heating for reflow soldering the components to the circuit board. For example, the surface may be formed by a sheet of soldering flux which becomes liquid during reflow temperatures and then evaporates leaving a neutral or water soluble residue. The surface may be a material that is soluble in a solvent (e.g. water) after being heated for solder reflow so that it is removed while washing the flux residue form the assembled circuit board after the reflow heating. Similarly, the surface may be connected to the coil by a glue that is removed by heating or washing so that the surface is also removed. alternatively, the surface may be mechanically connected to the coil so that it can easily and reliably be disconnected. For example, an extension of the surface may extend under the coils to hold the surface in place and then the surface could be removed without damaging the coil by elastically bending the surface extension or coil and pulling the surface off the coil. Alternately, the surface can be cut, broken, and/or stretched between the loops without damaging the coil so that the loop spacing can be adjusted. Preferably, the heating and washing of the circuit board changes the properties of the material of the surface so that it can more easily be removed after processing.

In FIG. 3, a component similar to that shown in FIG. 2, is placed on a circuit board. Terminal 123 rests on connection material 131 (e.g. eutectic Pb/Sn solder paste or conductive adhesive) on connection pad 133 of a wiring board 130.

The component includes a wire 121 bent to form a series of loops that define coil 122. Surface 125 allows the component to be placed on the circuit board using a vacuum probe, but is adapted to allow the spacing of the loops to be adjusted after the connection material 131 is cured.

Wiring board 130 includes a dielectric layer 139 (e.g. fiberglass) on which a wiring layer is formed (e.g. by photo-lithography). The wiring layer includes pads 133 and 135 for attaching component terminals and wires 136 and 137 extending between the pads. A layer 140 of solder resist covers the circuit board except for the pads to prevent the connection material from spreading from the pads and shorting the wires on the board surface.

In FIG. 4, component 151 is connected to circuit board 152 to form assembly 150. Terminals 153 and 154 are connected to pads 155 and 156 by solder alloy 157 and 158 respectively. Pads 155 and 166 are connected to wires 160 and 161 respectively. The wires extend to other pads of connectors or other components (not shown). The pick-up surface 162 of component 151 has a conformal shape similar to the top surfaces shown in FIGS. 2 and 3. The conformal surface can be removed, cut, broken, stretched or otherwise altered to allow adjusting the spacing between loops of the coil.

In FIG. 5 a component 170 has a flat top surface 171 for pick-up by a less flexible tip (not shown) of a vacuum probe.

Figure 6:
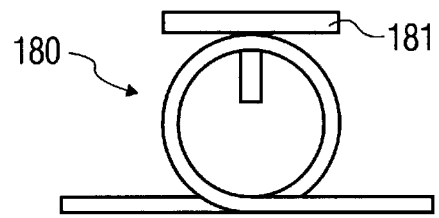
FIG. 6 shows a component in which a surface is mechanically clipped to the coil.
Figure 7:
FIG. 7 presents a side view of the surface of FIG. 6.
Figure 8:
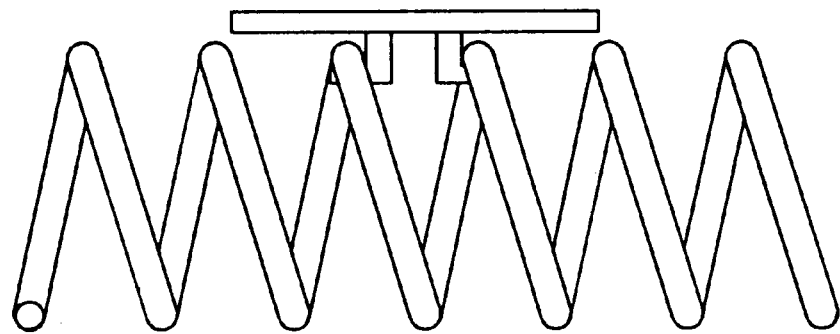
FIG. 8 presents a side view of the component of FIG. 6 prior to attachment.

In FIG. 6 component 180 includes surface 181 which is mechanically clipped to the coil. FIG. 7 shows a lateral view of surface 181, and FIG. 8 illustrates a lateral view of component 180 prior to attachment.

Figure 9:
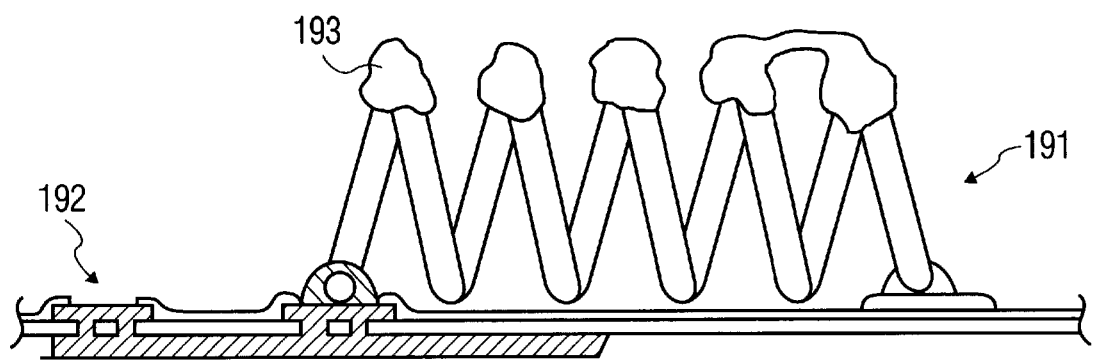
FIG. 9 illustrates a component attached to a circuit board substrate on which melted material of the surface does not interfere with bending the loops to tune the coil.

In FIG. 9, component 191 is attached to circuit board substrate 192. A residue 193 of melted material is all that remains of the pick-up surface after reflow heating. The melted material will not significantly interfere with bending the loops to change the spacing between the loops to tune the coil.

Figure 10:
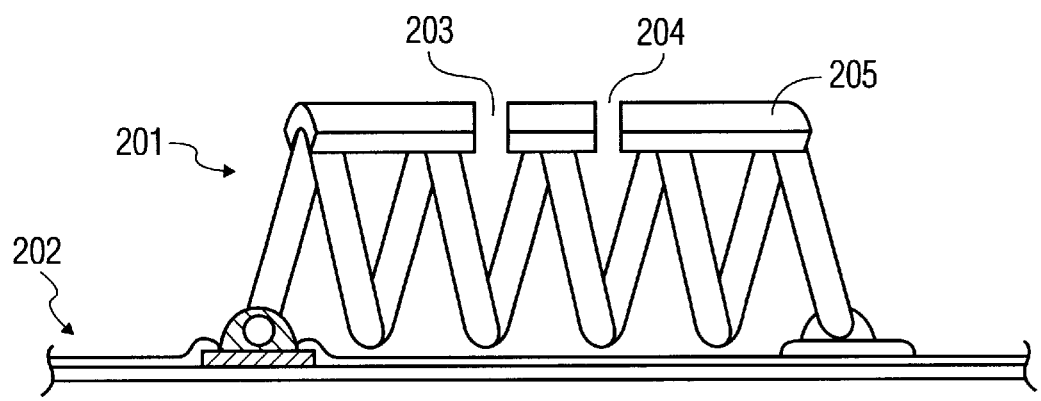
FIG. 10 illustrate a component in which sections of the surface have been cut to allow bending the loops to tune the coil.

In FIG. 10, component 201 is attached to wiring substrate 202. After the attachment, sections 203 and 204 of surface 205 have been cut to allow bending the loops to tune the coil.

Figure 11:
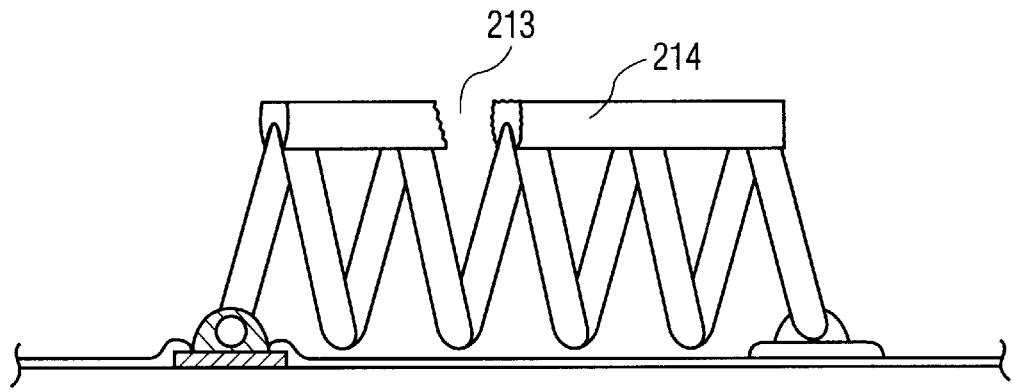
FIG. 11 shows a component in which a section of the surface is broken out for bending the loops to tune the coil.

In FIG. 11, component 211 is attached to printed circuit card 212 to form assembly 210. Section 213 of pick-up surface 214 is broken out to allow bending the loops to tune the coil.

Figure 12:
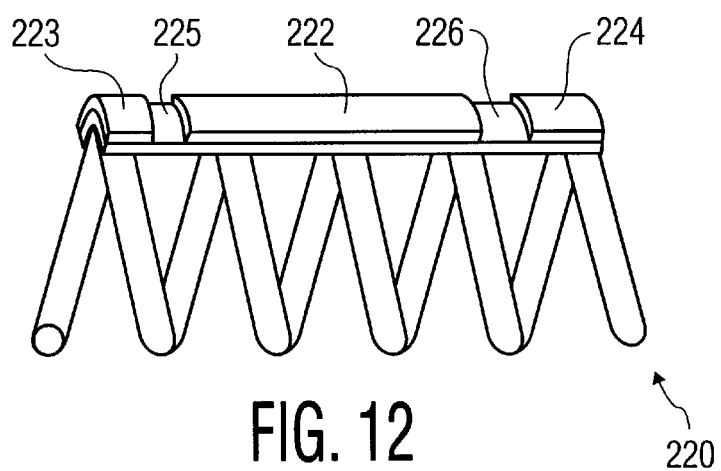
FIGS. 12 and 13 illustrate a component in which a cap section of the surface can be removed after the component is attached to a circuit board.
Figure 13:
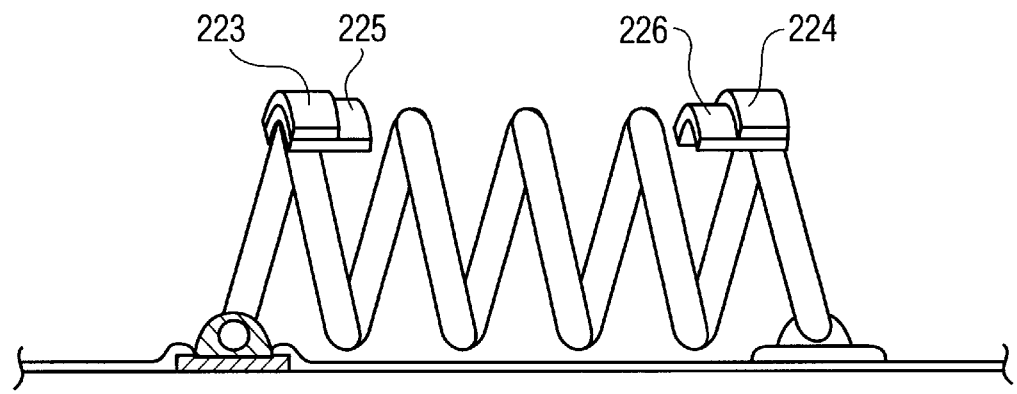

In FIG. 12 component 221 includes a surface with a cap portion 222 and cap holding portions 223 and 224. Bridging portions 225 and 226 extend between the holding portions and cap portion to keep the cap portion in place. In FIG. 13, after component 221 is attached to substrate 228 to form circuit board assembly 228, bridging sections 225 and 226 are broken or cut as shown.

Figure 14:
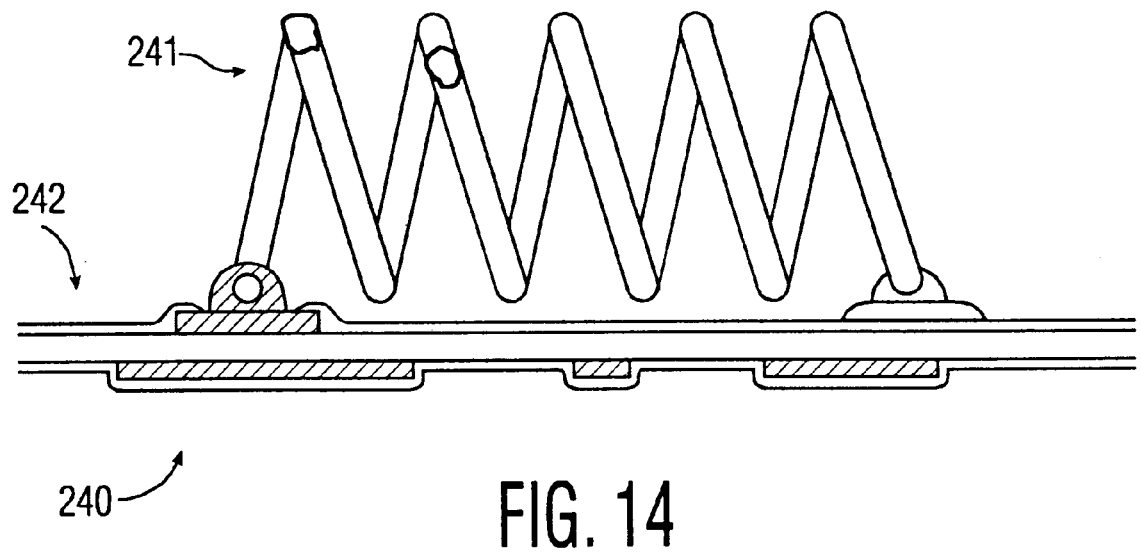
FIG. 14 illustrates a component with residue of the surface material after the surface has been otherwise washed off.

In FIG. 14 component 241 is connected to wiring card 242 to form assembly 240. After washing the circuit board only an insignificant quantity of residue 243 of the material of the pick-up surface remains.

The invention has been described with reference to specific embodiments including the best mode for carrying out the invention, and with sufficient detail that those of ordinary skill in the art can make and use the invention. Those skilled in the art may modify these embodiments or provide other embodiments within the spirit of the invention, and thus, the description does not limit the present invention to the disclosed embodiments. The invention is limited only by the following appended claims.

I claim:

1. A method of producing circuit boards, comprising the steps of:

providing at least one coil of loops that are multiple sequential loops;

providing a surface connected to the coil and extending over at least a subsection of a lateral surface of the coil;

feeding a circuit board into a pick-and-place machine;

feeding the coil into the pick-and-place machine;

picking-up the coil by the surface using a vacuum head of the pick-and-place machine;

connecting the terminals of the coil to corresponding terminals of the circuit board including placing the coil on the circuit board to form electrically conductive circuits of the circuit board;

providing a signal in the circuit board and monitoring a resulting output signal of the circuit board;

comparing the output signal with predetermined criteria; and adjusting the position of the loops of the coil for tuning the coil, if the output signal does not meet the predetermined criteria.

2. The method of claim 1, wherein adjusting the position of the loops includes removing at least a portion of the surface, so that the spacing between the adjacent loops of the coil can be changed to tune the coil.

3. The method of claim 1 in which the surface does not extend onto all of the loops and adjusting the position of the loops includes bending the loops, that the surface does not extend over, for tuning the coil.

4. The method of claim 1 in which the surface is sufficiently weak or flexible so that the loops on which the surface extends can be bent for adjusting the position of the loops without otherwise damaging the coil.

5. The method of claim 1 in which adjusting the position includes degrading the surface by exposing the surface to a solvent after the coil is connected to the circuit board, whereby the loops can be bent for adjusting the position of the loops.

6. The method of claim 5 in which adjusting the position of the loops includes degrading the surface by exposing the surface to water and at least a portion of a material of the surface is removed by washing in water without damaging the coils.

7. The method of claim 1 in which adjusting the position of the loops includes degrading the surface by heating the circuit board after connecting the coil to the circuit board after which the loops may be bent for adjusting the position of the loops.

8. The method of claim 7 in which a material of the surface flows when exposed to soldering temperature of eutectic Pb/Sn alloy so that after heating the circuit board to reflow the solder at least some of the coils become mechanically bendable to allow adjusting the position of the loops.

9. The method of claim 7 in which a material of the surface sublimates when exposed to soldering temperature of eutectic Pb/Sn alloy so that after reflow soldering the circuit board at least some of the coils become mechanically bendable for adjusting the position of the loops.

10. The method of claim 4 in which the surface is capable of being cut between adjacent loops of the coil using a tool without damaging the coil and then the position of the loops can be adjusted to tune the coil.

11. The method of claim 1, further comprising placing a metal soldering alloy onto the terminals of the circuit board and heating the circuit board to reflow solder the terminals of the coil onto the terminals of the circuit board.

12. The method of claim 1 in which:

at least a portion of the surface is removable from the coil without damaging the coil and adjusting the position includes removing that portion of the surface so that the position of the loops can be adjusted to tune the coil;

the surface does not extend onto all of the loops of the coil and adjusting the position includes bending the loops, that the surface does not extend over, for tuning the coil;

the surface is sufficiently weak or flexible so that the loops over which the surface extends can be easily bent for adjusting the position of the loops sufficient for tuning the coil without otherwise damaging the coil;

adjusting the position includes degrading the surface by exposing the surface to a solvent after the coil is connected to the circuit board whereby the loops can be bent to adjust the position of the loops for tuning the coil;

adjusting the position includes degrading the surface by exposing the surface to water and at least a portion of a material of the surface can be removed by washing in water without damaging the coil;

adjusting the position includes degrading the surface by heating the circuit board after which the position of the loops can be changed by bending the loops for tuning the coil;

the material of the surface flows when exposed to soldering temperature of eutectic Pb/Sn alloy so that after heating the circuit board to reflow the solder at least some of the coils become mechanically bendable to allow adjusting the position for tuning the coil;

the material of the surface sublimates when exposed to soldering temperature of eutectic Pb/Sn alloy so that after reflow soldering the circuit board at least some of the coils become mechanically bendable for adjusting the position for tuning the coil;

the surface is sufficiently soft and arranged so that it can be easily cut using a tool without damaging the coil for adjusting the positron of the loops for tuning the coil;

a material of the surface is a water soluble material;

the terminals are straight sections of wire extending tangentially to the loops of wire at each end of the coil of wire;

the coil is an air coil without any core;

the wire is between 0.05 mm and 1 mm in diameter;

the loops are spaced between 1.1 and 20 times the diameter of the wire;

the diameter of the loops is between 10 and 100 times the diameter of the wire;

the position of the loops is adjusted to exceed a manufacturing tolerances of the coil; and the method further comprises placing connecting material onto terminals of the circuit board;

the terminals of the circuit board are flat conductive pads; and the connecting material includes a metal soldering alloy and the method further comprises heating the circuit board to reflow solder the terminals of the coil onto the pads.

13. A method of producing circuit boards comprising the steps of:

providing at least one air-core coil comprising multiple sequential loops;

providing a surface connected to the coil and extending over at least a subsection of the coil;

picking-up the coil by the surface using a vacuum head of a pick-and-place machine;

placing the coil on a circuit board using the vacuum head;

electrically connecting the coil to the circuit board and adjusting the position of the loops of the coil to tune the coil.

14. The method of claim 1 in which the loops are spaced between 2 and 10 times the diameter of the wire.

* * * * *